US010911009B2

(12) United States Patent
Hogan et al.

(10) Patent No.: US 10,911,009 B2
(45) Date of Patent: Feb. 2, 2021

(54) CURRENT-SOURCE SWITCHING HYBRID AUDIO AMPLIFIER

(71) Applicant: Apple Inc., Cupertino, CA (US)

(72) Inventors: Roderick B. Hogan, San Francisco, CA (US); Michael B. Nussbaum, Santa Cruz, CA (US); Todd K. Moyer, Portland, OR (US)

(73) Assignee: APPLE INC., Cupertino, CA (US)

( * ) Notice: Subject to any disclaimer, the term of this patent is extended or adjusted under 35 U.S.C. 154(b) by 69 days.

(21) Appl. No.: 16/204,897

(22) Filed: Nov. 29, 2018

(65) Prior Publication Data

US 2020/0106407 A1  Apr. 2, 2020

Related U.S. Application Data

(60) Provisional application No. 62/738,509, filed on Sep. 28, 2018.

(51) Int. Cl.
*H03F 1/26* (2006.01)
*H03F 3/68* (2006.01)
*H03F 3/217* (2006.01)
*H03F 3/185* (2006.01)
*H04R 3/00* (2006.01)

(52) U.S. Cl.
CPC ............ *H03F 3/2173* (2013.01); *H03F 1/26* (2013.01); *H03F 3/185* (2013.01); *H04R 3/00* (2013.01); *H03F 2200/03* (2013.01); *H03F 2200/33* (2013.01)

(58) Field of Classification Search
CPC ............ H03F 3/2173; H03F 1/26; H03F 3/68

USPC .......................................... 381/120; 330/295
See application file for complete search history.

(56) References Cited

U.S. PATENT DOCUMENTS

| 5,854,573 | A | * | 12/1998 | Chan ................... H03F 1/086 330/292 |
| 6,157,252 | A | * | 12/2000 | Compton ............. H01L 29/94 257/E29.345 |
| 2006/0049869 | A1 | * | 3/2006 | Meng ................... H03F 1/02 330/10 |
| 2011/0304400 | A1 | * | 12/2011 | Stanley ................ H03F 1/26 330/295 |

OTHER PUBLICATIONS

Class-D Amplifier Design Basics II, Chapter 2; International IOR Rectifier Feb. 19, 2009; 74 pages.
"Voltage source vs. current source amplifiers", Audiogon Discussion Forum, Feb. 2, 2017, 8 pages.
Lopez-Martin, Antonio, et al., "Compact class AB CMOS current mirror", European Conference on Circuit Theory and Design, Aug. 28, 2001, 5 pages.

* cited by examiner

*Primary Examiner* — Vivian C Chin
*Assistant Examiner* — Ubachukwu A Odunukwe
(74) *Attorney, Agent, or Firm* — Womble Bond Dickinson (US) LLP

(57) ABSTRACT

An audio amplifier has an analog current source amplifier and a class D amplifier. The analog current source amplifier is active in a first mode to drive a speaker when an audio signal has smaller amplitude. The class D amplifier is active in a second mode to drive the speaker when the audio signal has larger amplitude. Other aspects are also described and claimed.

20 Claims, 6 Drawing Sheets

CURRENT-SOURCE SWITCHING HYBRID AUDIO AMPLIFIER

This application claims priority to U.S. provisional patent application No. 62/738,509 filed on Sep. 28, 2018, the disclosure of which is incorporated in its entirety by reference herein.

An aspect of the disclosure here relates to class D or switching audio amplifiers and current source amplifiers. Other aspects are also described.

BACKGROUND

Audio systems with low noise are much sought after, as the presence of noise decreases listening enjoyment. There are many sources of noise in audio systems, including amplifier hiss, media, power supply hum, component vibration, external noise intrusion, etc. One source of noise is electromagnetic interference, which can couple at acoustic frequencies into the path between an audio amplifier output and its load which is one or more speakers. This may sometimes be mitigated with the addition of adequate electromagnetic shielding, but there is an ongoing need for reduction of noise from electromagnetic coupling in audio systems.

SUMMARY

Audio amplifiers are described herein that feature current source drive in order to reduce, attenuate or reject audio noise that may be due to electromagnetically coupled interference. In one instance, a hybrid amplifier has a circuit that operates alternatively (one at a time) in class D amplifier or switching mode and in analog current source amplifier mode (also referred to here as current drive mode). The transition between these modes takes place automatically (transparent to a user/listener) and in accordance with the level of the audio signal that is being amplified and is driving a speaker (during playback). This provides the benefits of power efficiency in class D mode and lower noise in analog current source amplifier mode. One use for the hybrid amplifier is in an earbud where the benefits of power efficiency are especially desirable given the constraints on battery size.

The analog current source amplifier is arranged to be active in a first mode of operation of the audio amplifier, to drive a speaker. The first mode is active when the audio signal has smaller amplitudes. The class D amplifier is active in a second mode of operation of the audio amplifier (amplifying the same audio signal and driving the same speaker). The second mode is active when the audio signal has larger amplitudes. A transition controller (transition control circuit) may evaluate a level of audio signal against a threshold to detect the smaller and larger amplitudes, and in response signals the appropriate mode of operation.

In one example, the audio amplifier has transistor switches arranged in an H bridge. The H bridge operates as part of a class D amplifier (and couples to the speaker as its load). The audio amplifier also has transistors arranged as an analog amplifier. The analog amplifier has current sources and also couples to the speaker as a load. The transition controller activates the analog amplifier in a first mode for smaller amplitude segments of the audio signal, and the H bridge in a second mode for larger amplitude segments of the audio signal.

In another example, an earbud has a housing, a wireless transceiver, a speaker, an analog current source amplifier and a class D amplifier, all in the housing. The analog current source amplifier is active in a first mode of operation where it amplifies an audio signal to drive the speaker, when the audio signal has a smaller amplitude. The class D amplifier is active in a second mode of operation where it (not the analog current source amplifier) amplifies the audio signal to drive the speaker, when the audio signal has a larger amplitude.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Figure 1:
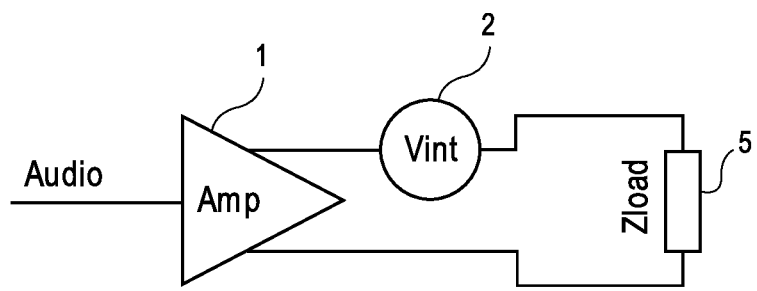
FIG. 1 depicts an interfering voltage induced between an amplifier and a transducer, such as a speaker in an audio system.

FIG. 1 depicts the concept of an interfering voltage that is induced between an amplifier 1 and its load 5 (having impedance Zload), a transducer such as a speaker in an audio system. A system problem exists particularly in headphone products whereby an interfering voltage (Vint) is induced between the amplifier 1 and its load 5 (e.g., a voice coil in a speaker driver). Interfering voltage Vint, represented by a voltage source 2, modulates the current that flows through the voice coil of the transducer, therefore modulating the force applied to the diaphragm of the transducer and the sound produced. It should be noted that Vint could be induced in either the voice coil itself or in the electrical connections from the amplifier to the voice coil.

The load impedance Zload has a resistive component and an inductive component. If the output resistance of the amplifier 1 is close to zero, then no attenuation of the interfering voltage occurs, i.e., Vint modulates the load current Iload directly with no attenuation. If the output resistance of the amplifier is increased, the interfering voltage is attenuated. Operating an amplifier with increased output resistance is desirable, to obtain attenuation of the effect of Vint. For example, if the output resistance of the amplifier were to be 9 times the magnitude of the load impedance, there would be a 10-times (20 dB) attenuation of the interfering voltage. However, increasing output resistance decreases the overall efficiency of the amplifier, since more electrical power is dissipated in the increased output resistance (than is the case with a low or zero output resistance). Noting this lower efficiency, as compared to a switching or class D amplifier that is operating with low or zero output resistance, it may be desirable for a hybrid audio amplifier to use a current-source drive at low signal amplitudes and transition to class D mode at high signal amplitudes. Since power consumption is important in battery powered devices such as wireless headphones, one goal of the presently described hybrid amplifier is to increase amplifier output resistance, to attenuate electromagnetically coupled interfering voltage and thereby reduce noise heard from the speaker, while also avoiding a large decrease in power efficiency as much as possible.

In a class D audio amplifier, an audio input signal (e.g., 20 Hz-20 kHz) to be amplified is received and compared to a high frequency triangle or sawtooth waveform (e.g., having a fundamental or carrier frequency several times higher than the highest frequency component of interest in the audio input). This results in the creation of a pulse width modulation (PWM) signal that is then used by control logic (class D amplifier controller) to control a "duty cycle" of transistors M1, M3 that are operated as high side switches, and transistors M2, M4 that are operated as low sides switches of an H bridge 7 that constitutes an output power stage of the audio amplifier—see FIG. 2. The intervals during which the switches are closed and open are modulated by the control logic to produce an amplified digital signal which is at the same time being low pass filtered (LPF) to remove the PWM carrier frequency, leaving an amplified version of the audio input that is driving the load 5. Note that references in this disclosure to a transistor being operated as a switch that is "closed" and "open" are equivalent to the transistor being "on" or "turned on" and "off or "turned off", respectively.

Figure 2:
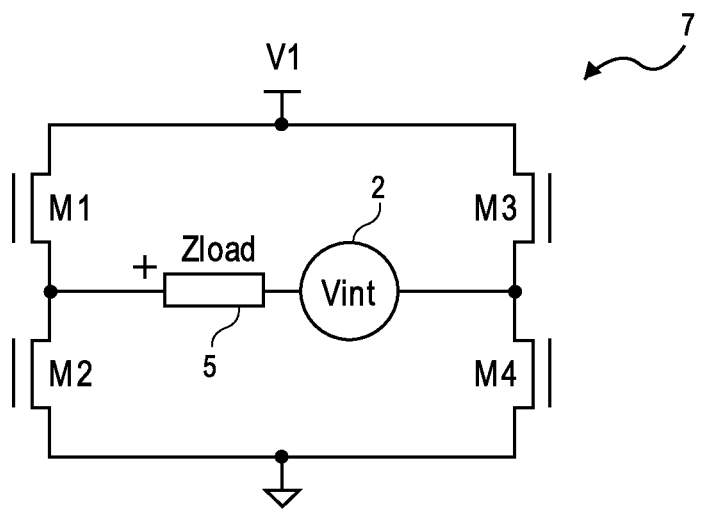
FIG. 2 is a circuit diagram of a H bridge in a class D amplifier.

Referring to FIG. 2, the H bridge 7 may be the output stage of a class D amplifier (also referred to as a switching amplifier) that is amplifying an input audio signal. The H bridge 7 has transistors M1, M3 as high side switches each of which has one end connected to a common supply node V1 and another end connected to a respective output node of the audio amplifier. The transducer, a load 5 with impedance Zload, e.g., a speaker, has its two sides, ends or terminals connected to the respective output nodes of the audio amplifier. The H bridge 7 also has transistors M2, M4 as low side switches each of which has one end connected to a power return node (here, ground) and another end connected to the respective output node of the audio amplifier. Operation of the H bridge as a class D amplifier may be through duty cycle control of the transistors M1-M4 (switch closed and switch open times, during each switching cycle) in accordance with the PWM signal. Modulation of the on-off (closed-open) or duty cycles of these switches (the switching cycle period being at least several times smaller than the period of the highest audio frequency component of interest) is performed through the control logic (also referred to as a class D amplifier controller), which could be implemented using known analog and digital hardwired circuitry. Voltage across or current through the transducer, i.e., the speaker or load 5, in one direction is brought about by activating (e.g., turning on) one set of diagonally opposed transistors M1 and M4, and in the other direction is brought about by activating (e.g., turning on) the other set of diagonally opposed transistors M3 and M2 (in alternating fashion). In this disclosure, activating a switch or transistor means enabling the switch or transistor to respond to a PWM signal (by repeatedly opening and closing to transfer energy into the transducer or load 5 from the supply node V1.) Respective pulse widths or duty cycles of such activations (on-time or switch closed time vs. off-time or switch open time) determine the value of the voltage established across the load 5, and current through the load 5, and direction or polarity thereof, which will be in accordance with the audio input.

Figure 3:
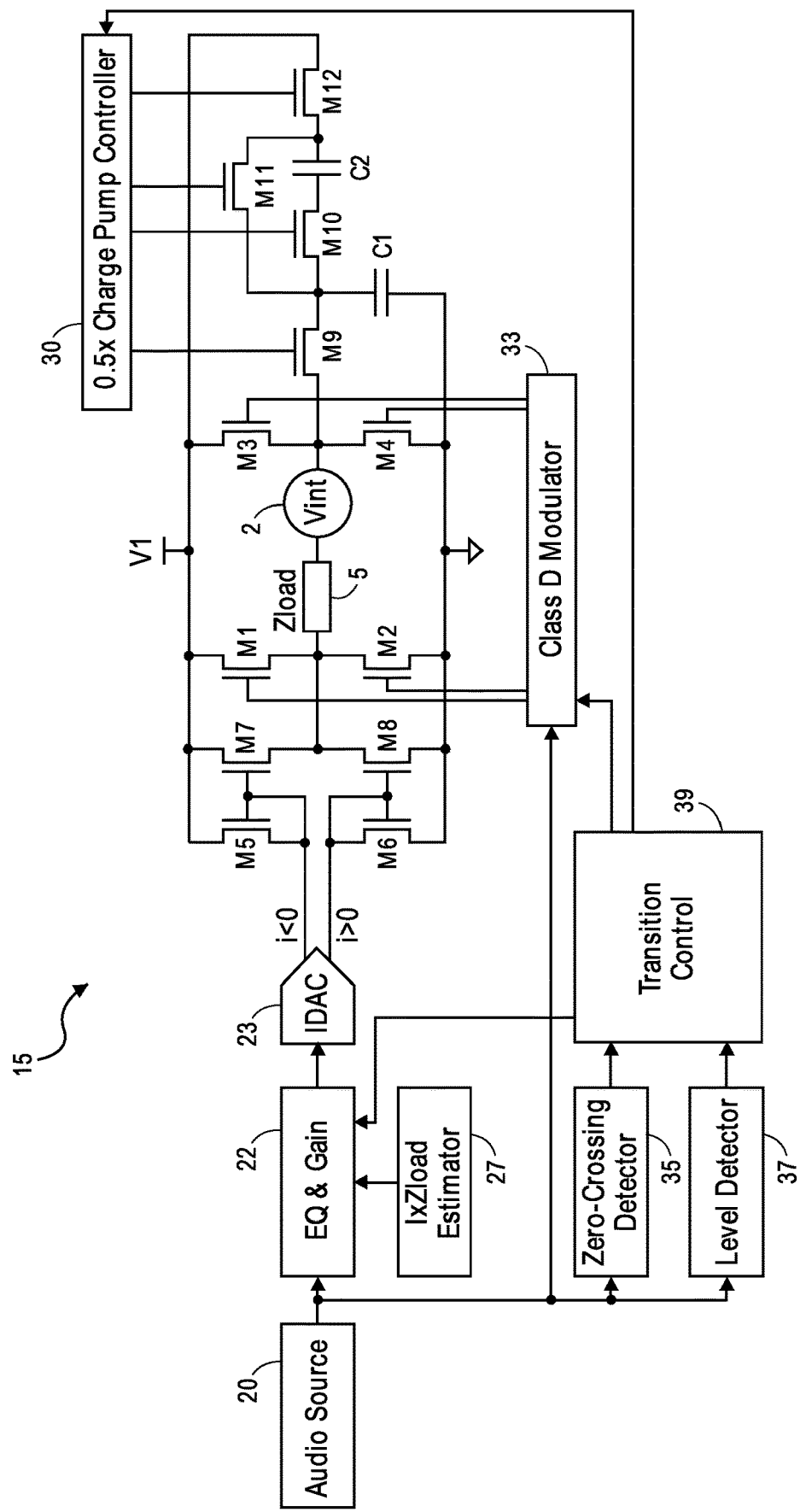
FIG. 3 is a circuit diagram of a hybrid amplifier that includes an H bridge operated as a class D amplifier, and a linear amplifier with current drive.

FIG. 3 is a circuit diagram of a hybrid amplifier 15 that includes an H bridge output stage being operated as a part of a class D amplifier, and a linear amplifier that produces current drive (also referred to here as a current source amplifier), both of which serve to amplify the same input audio signal from an audio source 20 when driving the same load 5. For lower amplitude segments of the audio signal, where reduction of electromagnetically coupled interference from the interfering voltage represented by the voltage source 2 results in a user noticeable audible improvement, the hybrid amplifier 15 is configured to operate in a current drive mode (also referred to here as linear mode or analog current source amplifier mode) in which a linear amplifier is driving the load 5. In this example, the current drive mode uses (or the linear amplifier comprises) a current output analog-to-digital converter IDAC 23 with split, dual current drive output and current mirrored transistors (e.g., the current drive output feeding the high-side PMOS mirror devices M5, M7 is a current sink, and the current drive output feeding the low-side NMOS mirror devices M6, M8 is a current source.) Transistors M5 and M7 operate as one current mirrored pair for the positive swing of the audio signal, and transistors M6 and M8 operate as another current mirrored pair for the negative swing of the audio signal. The upper transistors M5, M7 may be PMOS FETs while the lower transistors M6, M8 may be NMOS FETs in this version, but in other variations could be bipolar or other types of transistors.

For higher amplitude audio signals, where the electromagnetically coupled interference is less audible to a listener, but where amplifier efficiency is important for overall system efficiency and battery life, the hybrid amplifier 15 operates in a class D amplifier mode. Class D amplifier mode uses an H bridge operated by the class D modulator 33, which drives the transistors M1, M2, M3 and M4 similarly to the H bridge 7 of FIG. 2 above. In class D amplifier mode, transistors M7, M8 are kept turned off.

It should be noted then that class D amplifier mode employs a switching amplifier, and current drive mode employs a true analog current source amplifier, not a switching source amplifier. In current drive mode, the transistors M1-M4 that make up the H bridge output stage are kept turned off (the switches are open). Transitioning between the two amplifier sections or modes is accomplished by a transition control 39, based on a digital input audio signal (from an audio source 20) that has been fed to a level detector 37, to decide when to transition between the current drive mode and the class D amplifier mode based on a level of the input audio signal. The transition may be abrupt or blended, in various versions. Level-based or time-based hysteresis may be used to reduce the frequency of transitions to help with reducing the audibility of transition events.

The hybrid amplifier 15 depicted in FIG. 3 improves efficiency of the current drive mode by maintaining a common mode voltage $V_{CM}$ at one terminal of the load 5 as shown. In this particular example, a 0.5× charge pump is used, operated by 0.5× charge pump controller 30, to generate a high-efficiency common-mode voltage $V_{CM}$=0.5×V1 (about midpoint of the power supply voltage V1 relative to power return voltage, ground or zero in this case). The current drive mode uses an analog current source amplifier to drive a current to one side or terminal of the load 5 according to the audio signal, and drive the other side or terminal of the load 5 to a selected voltage $V_{CM}$ using the charge pump. In this version, the charge pump is made up of transistors M9, M10, M11 and M12 and capacitors C1 and C2, pumping charge from two power supply rails, e.g., V1 and ground. Other types of large pumps could be devised. Assuming an audio power of 100 μW (microwatts), 1 V (volt) is a good choice for V1 in some versions, but other power supply voltages are applicable to further versions. The 1 V power supply voltage and half power supply voltage as the common mode voltage $V_{CM}$ provide a maximum of 0.5 V across the current source amplifier output, allowing headroom for the audio signal, the interfering signal Vint, $V_{DSAT}$ (saturation voltage) of M7, M8, and any out-of-band signal that may be present in the input audio signal from the audio source 20 in low-latency applications. With a 0.5×V1 $V_{CM}$, it is not necessary to use M3, M4 to commutate the load 5, and the hybrid amplifier 15 thus avoids cross-over distortion as a result.

When changing between current drive mode and class D amplifier mode, one goal is to have the same voltage across the load 5 and the same amplifier gain for the two amplifier types. To reduce gain variation between current drive mode and class D mode, an estimator 27 may be provided that estimates a product of the load current and load impedance, $I \times Z_{LOAD}$. Note that load impedance Zload may vary based on the temperature of the transducer voice coil, as further discussed below. Some versions of the audio amplifier described below measure, and other versions estimate, a temperature of the transducer voice coil (which is then used to compute the estimate for Zload). Some versions have load impedance versus temperature calibrated by testing, for example during manufacture. The estimator 27 cooperates with the equalizer and gain module 22, to set equalization and gain for each of the amplifier types and ensure that the transition between modes is smooth without an abrupt change in gain and/or load current or voltage, which would be audibly perceived by the listener as a pop or other sound disruption. When transitioning from current drive mode (a smaller amplitude segment of the audio signal) to class D amplifier mode (a larger amplitude segment of the audio signal), the estimator 27 obtains a present value for the load current from the IDAC 23, and also estimates the present load impedance. From these, the estimator 27 estimates the voltage that the class D amplifier mode should produce (to avoid an abrupt change relative to the present value), and adjusts the equalization and gain of the input audio signal, through the equalization and gain module 22, accordingly.

When transitioning from class D amplifier mode to current drive mode, the estimator 27 estimates the present voltage that the H bridge (transistors M1, M2, M3 and M4) produces across the load 5, and also estimates the present load impedance. From these, the estimator 27 estimates the current that the IDAC 23 should produce (to avoid an abrupt change relative to the present value), and adjusts the equalization and gain of the input audio signal, through the equalization and gain module 22, accordingly.

During both modes and the transitions, equalization (e.g., spectral shaping) imparted by the equalization and gain module 22 should be based on a model (or calibration) of load impedance versus frequency. One example of the variance in load impedance vs. frequency that should be addressed by such an approach, is as follows. Consider the case of a 3× change in $Z_{load}$ (which may be typical of certain headphone speakers)—that will cause a 10 dB change in load current around a resonance frequency, when changing from current drive mode to class D amplifier mode (assuming no effort is made to match load voltage and amplifier gain at the mode transition.) To avoid this mismatch, one version of the hybrid amplifier 15 equalizes the input audio signal during the current drive mode, such that load current becomes similar vs. frequency to what it would be in class D amplifier mode.

The gain of the current drive mode (that is imparted on the input audio signal) could be estimated based on design information for the load 5 and for the current drive mode amplifier, or it could be estimated using calibration by the amplifier manufacturer and/or by the transducer manufacturer. Further calibration could be performed while manufacturing the end product. Real time estimation however would offer better performance. Sensing the die temperature of an integrated circuit would also allow compensation for variations in gain of the current drive mode. The temperature of the voice coil may be estimated indirectly by calculating the power dissipated in the transducer and, using a thermal model, estimating the voice coil temperature. The resistance of the voice coil may also be measured directly using sensing circuitry that produces a pilot tone that is driving the load 5, or while outputting a user audio program or other stimulus.

To mitigate audio artifacts, the hybrid amplifier 15 should transition its output resistance changes, from one mode to another, around zero-crossings in the audio signal. A zero crossing detector (ZCD) 35 may be used to signal the transition only when the input audio signal level is close to zero, minimizing the glitch energy caused by gain differences between the current drive mode and the class D amplifier mode. The zero crossing detector 35 monitors for and detects zero crossings of the input audio signal provided by the audio source 20 and informs the transition control 39, which in turn informs the equalization and gain module 22 of an upcoming transition between modes. The level detector 37 monitors voltage level of the input audio signal. With information about both the level of the audio signal and the zero crossings of the audio signal, the transition control 39 guides the equalization and gain module 22, the class D modulator 33 and the charge pump controller 30 in transitions between current drive mode and class D amplifier mode.

Figure 4:
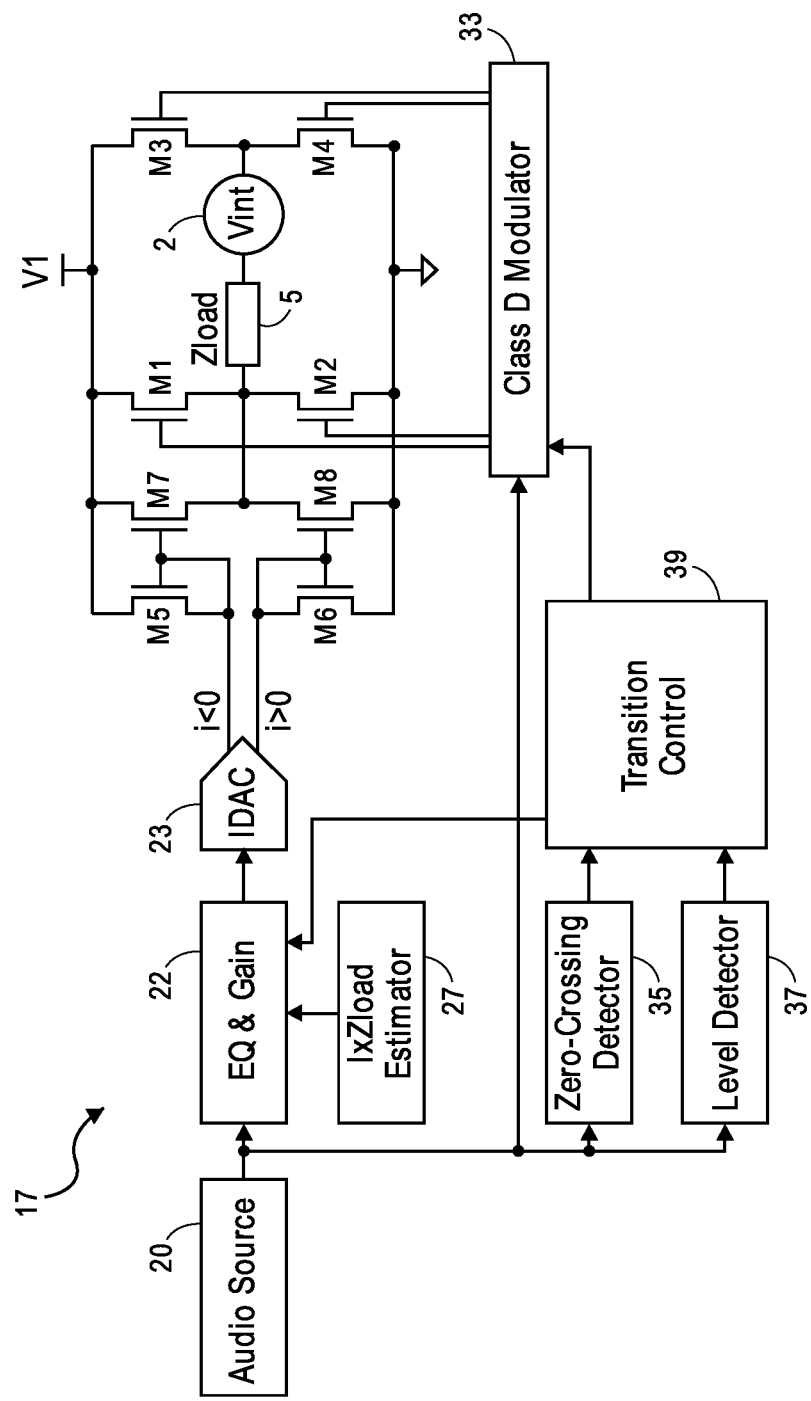
FIG. 4 is a circuit diagram of a further hybrid amplifier that includes a class D amplifier and a linear amplifier, but no charge pump.

FIG. 4 is a circuit diagram of a further hybrid amplifier 17 that includes a class D amplifier and a linear amplifier, but no charge pump. This circuit is similar to the version in FIG. 3 except that it eliminates the 0.5× charge-pump of the version in FIG. 3, and instead commutates (i.e., switches) the load 5 using transistors M3, M4 of the H bridge to produce the desired common voltage Vcm at the load terminal that is common to M3, M4. In this case, transistors M3 and M4 are dual purposed in that they are operated by a modified version of the class D modulator 33 in both the class D amplifier mode and in the current drive mode.

Figure 5:
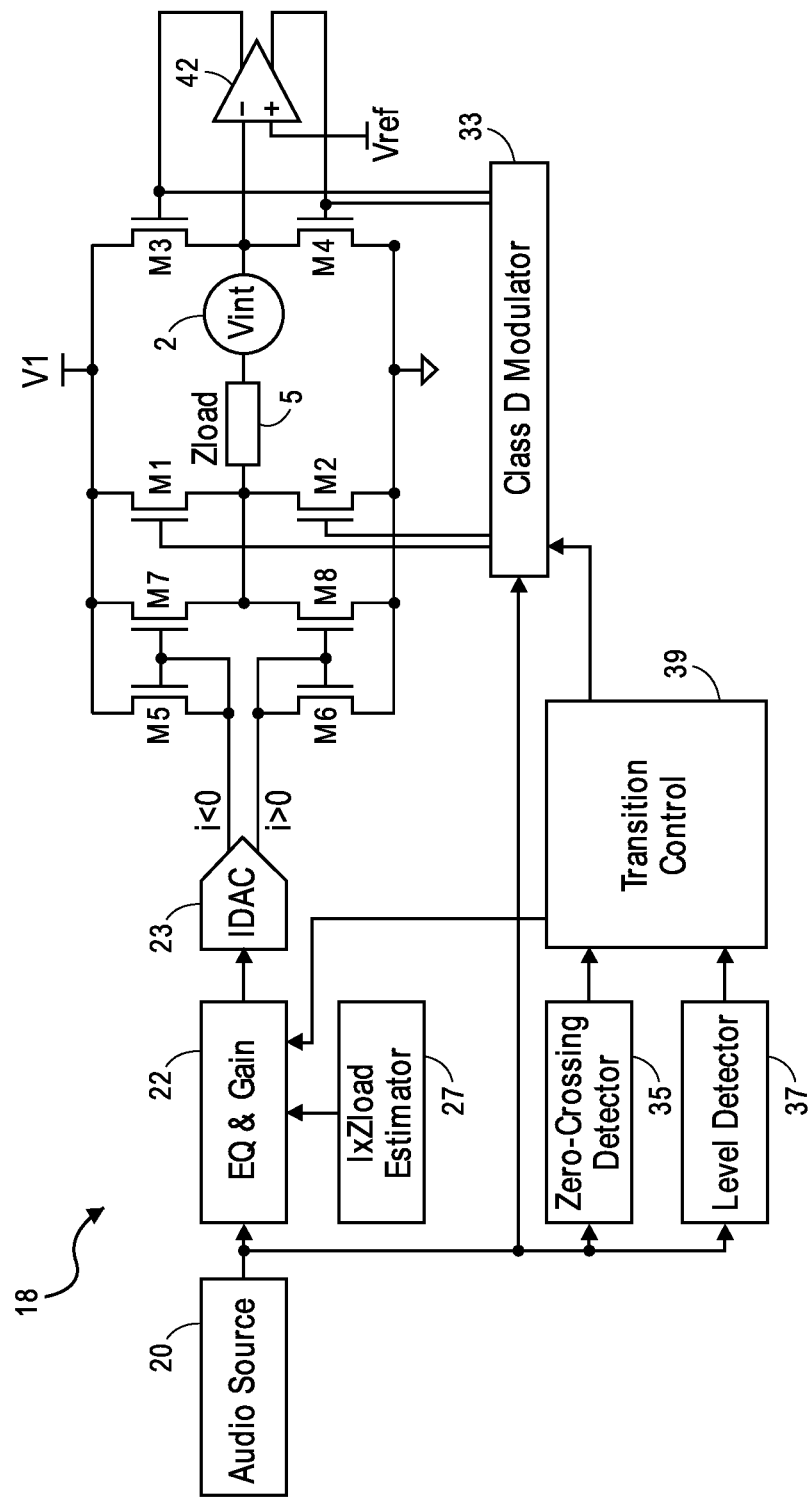
FIG. 5 is a circuit diagram of a further hybrid amplifier that includes a class D amplifier and a linear amplifier, with a common mode voltage for the load during linear amplifier operation.

FIG. 5 is a circuit diagram of a further hybrid amplifier 18 that includes a class D amplifier and a linear amplifier, with a common mode voltage for the load during linear amplifier operation. This approach uses an amplifier 42 to drive M3, M4 establishing a 0.5×V1 $V_{CM}$ at a terminal of the load 5 that is common to M3, M4. This solves the cross-over distortion issue but still has lower efficiency in comparison to the circuit in FIG. 3. Using M3, M4 to set Vcm is not mandatory—and an amplifier could instead be used to drive the $V_{CM}$ directly.

Figure 6:
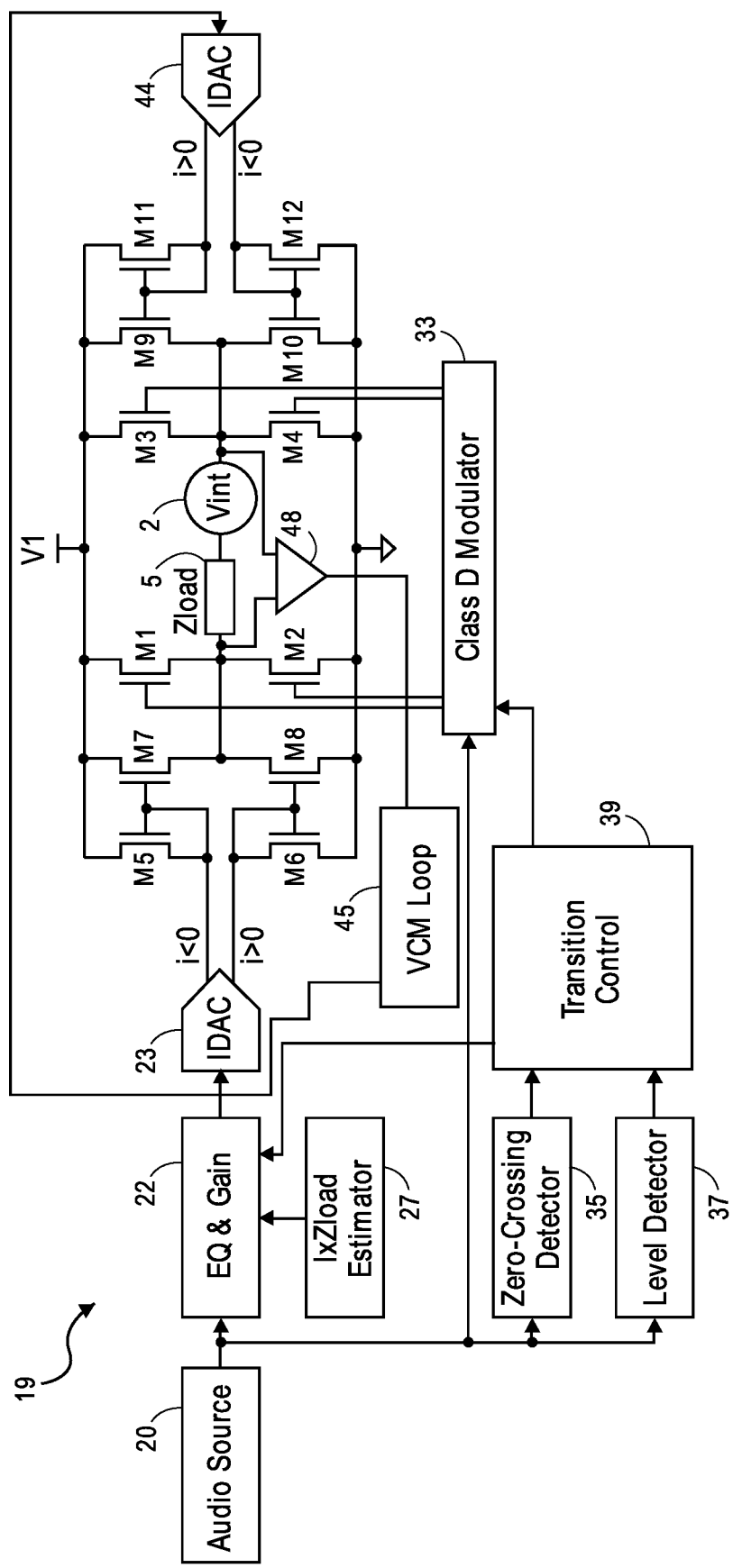
FIG. 6 is a circuit diagram of a further hybrid amplifier that includes a class D amplifier and a linear amplifier, with current sources at both sides of the load during linear amplifier operation.

FIG. 6 is a circuit diagram of a further hybrid amplifier 19 that includes a class D amplifier and a linear amplifier, where the linear amplifier is implemented by current sources at both sides of the load 5 (as compared to just one side of the load in the versions of FIGS. 3-5). A near terminal of the load 5 is driven directly by the IDAC 23, while a far terminal of the load 5 is driven by another IDAC 44 under control of a common-mode voltage feedback loop, Vcm loop 45, which serves to keep the common mode voltage at the far terminal well defined based on sensing voltage of the load 5 using a sense amplifier 48.

Several other variations to the hybrid audio amplifiers 15, 17, 18, 19 described above in relation to FIGS. 3-6, are possible. For example, the output resistance of while operating in current drive mode (linear amplifier) may be increased using cascode techniques if desired. In class D amplifier mode, the H bridge (transistors M1, M2, M3 and M4) can produce up to plus or minus the power supply voltage V1 across the load 5, while in current drive mode the linear amplifier can provide up to plus or minus one half the power supply voltage V1 (across the load 5). In some cases, these figures are symmetric but in other instance they need not be. Also, instead of a single ended power supply as shown (V1 at one rai and ground at the other), a split power supply (positive rail and negative rail) could be used instead, with ground between the positive power supply rail and the negative power supply rail. Again, this could be symmetric (e.g., +V1, −V1), or it could be asymmetric (e.g., V1, V2 where |V2| is not equal to |V1|). In a split supply variation of FIGS. 3 and 5, the far terminal of the load 5 that is common to transistors M3, M4 could be connected to the ground (that is between positive and negative power supply rails), so that the common mode voltage in that case would be supplied by ground rather than by the charge pump (FIG. 3) or the amplified output from amplifier 42 referenced by Vref (FIG. 5). With reference to FIGS. 3-6, in the current drive mode, the linear amplifier could operate in class AB where there is some minimum, non-zero current through transistors M5, M6 and also through transistors M7, M8, which may reduce crossover distortion.

Figure 7:
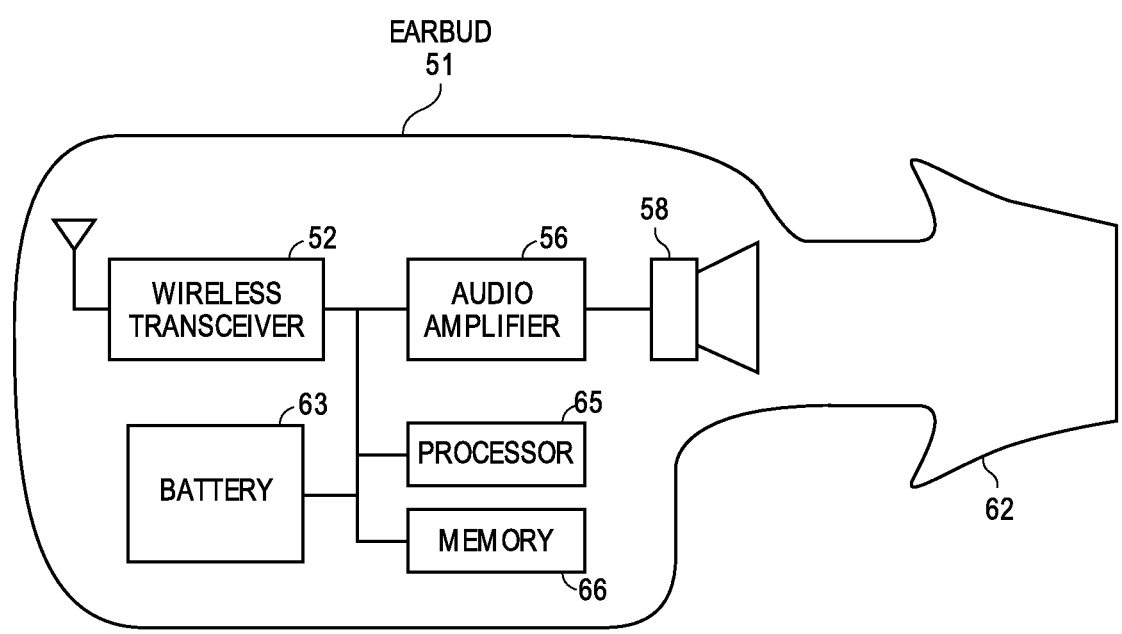
FIG. 7 depicts an earbud that includes an audio amplifier and a speaker and can implement aspects of an amplifier circuit described with reference to FIGS. 2-6 for attenuation or rejection of noise.

The audio amplifiers described here may be especially useful to attenuate audible noise that may be more likely to appear in personal electronic devices referred to as hearables, which include hearing aids, headsets and especially earbuds, and personal sound amplification products. As an example of such applications, FIG. 7 depicts an earbud 51 that includes an audio amplifier 56 and a speaker 58 and can implement aspects of the hybrid amplifier circuits shown in and described above with reference to FIGS. 3-6. A wireless transceiver 52 communicates with another electronic device such as a smartphone or a tablet computer (not shown) to receive the input audio signal in digital encoded form. A processor 65 with memory 66 receives the digitally encoded audio signal from the wireless transceiver 52, processes the audio signal (e.g., decodes and enhances it for improved sound) and forwards the input audio signal to the audio amplifier 56 whose output drives the speaker 58, thereby producing the sound of the audio signal. This sound is heard by a listener who is wearing the earbud 51, through an earpiece 62 of the earbud 51 that is designed to be in the ear of the listener. In other instances of a hearable, the earpiece 62 is designed to be held against (not necessarily inside) the ear of the listener. A battery 63 supplies electrical power for the system. Other aspects such as a charging port for the battery 63, one or more input controls (e.g., a button, a tap sensor), etc., are readily envisioned and implemented.

With reference to FIGS. 3-7, various components of such systems as described above can be implemented with analog circuits, digital circuits, processor-based circuits and programming, and combinations thereof as readily devised, in keeping with the teachings herein.

While certain aspects have been described and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. For example, while FIG. 6 depicts a linear amplifier operated in closed-loop, it is also possible to configure the class D amplifier to operate in closed-loop. Also, while FIG. 7 depicts an earbud that is a suitable application for the hybrid audio amplifier described herein and its variations, the hybrid amplifier is also suitable for other audio systems. In addition, while the audio source 20 is providing a digital input audio signal in the version depicted in FIG. 3, an analog-to-digital converter (ADC) could be included in the audio amplifier for interfacing directly with an analog audio source. The description is thus to be regarded as illustrative instead of limiting. To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An audio amplifier for amplifying an audio signal, the audio amplifier comprising:
    an analog current source amplifier arranged to be active in a first mode of operation of the audio amplifier by amplifying the audio signal to drive a speaker when the audio signal has a smaller amplitude; and
    a class D amplifier arranged to be active in a second mode of operation of the audio amplifier by amplifying the audio signal to drive the speaker when the audio signal has a larger amplitude.

2. The audio amplifier of claim 1, wherein the class D amplifier comprises an H bridge and a class D modulator coupled to the H bridge.

3. The audio amplifier of claim 1, wherein the analog current source amplifier comprises a current-sourcing digital to analog converter with first and second split outputs, and current mirroring in each of the first and second split outputs.

4. The audio amplifier of claim 1, wherein the analog current source amplifier comprises a current mirroring class AB amplifier.

5. The audio amplifier of claim 1, further comprising:
a load impedance estimator; and
an equalizer coupled to the load impedance estimator and the analog current source amplifier, to spectrally shape the audio signal for the analog current source amplifier according to estimated impedance of the speaker.

6. The audio amplifier of claim 1, further comprising:
a zero crossing detector in response to which the amplifier transitions between the first mode and the second mode at a zero crossing of the audio signal.

7. The audio amplifier of claim 1, further comprising:
a charge pump to hold one terminal of the speaker at a selected constant voltage during the first mode.

8. The audio amplifier of claim 1, further comprising:
an amplifier coupled to one terminal of the speaker to drive a portion of the analog current source amplifier to hold the one terminal of the speaker at a selected constant voltage during the first mode.

9. The audio amplifier of claim 1, wherein the analog current source amplifier comprises a first current source to couple to a first terminal of the speaker and a second current source to couple to a second terminal of the speaker.

10. An audio amplifier for amplifying an audio signal, comprising:
a plurality of transistors in an H bridge as a class D amplifier to couple to a speaker as a load;
a plurality of transistors in a current source amplifier to couple to the speaker as the load; and
a transition controller to activate the current source amplifier and deactivate the H bridge in a first mode during smaller amplitude segments of an audio signal, and activate the H bridge and deactivate the current source amplifier in a second mode during larger amplitude segments of the audio signal.

11. The audio amplifier of claim 10, further comprising:
a load impedance estimator and an equalizer, coupled to the current source amplifier to spectrally shape the audio signal according to estimated impedance of the speaker.

12. The audio amplifier of claim 10, further comprising:
a zero crossing detector coupled to the transition controller, wherein the transition controller determines when to activate the class D amplifier and when to activate the current source amplifier based on output of the zero crossing detector.

13. The audio amplifier of claim 10, further comprising:
a charge pump to couple to one side of the load and hold the one side of the load at a selected voltage in the first mode.

14. The audio amplifier of claim 10, further comprising:
an amplifier having inputs to couple to one side of the load and a reference voltage, and having an output coupled to hold the one side of the load at the reference voltage in the first mode.

15. The audio amplifier of claim 10, wherein the current source amplifier comprises:
a current sourcing digital to analog converter;
a first subset of the plurality of transistors as a first current mirroring current source from a first split output of the current sourcing digital to analog converter; and
a second subset of the plurality of transistors as a second current mirroring current source from a second split output of the current sourcing digital to analog converter.

16. A hearable, comprising:
a hearable housing having an earpiece to be held inside or against an ear of a listener;
a wireless transceiver in the housing;
a speaker in the housing to output sound through the earpiece;
an analog current source amplifier in the housing, to be active in a first mode of operation by amplifying an audio signal to drive the speaker when the audio signal has a smaller amplitude; and
a class D amplifier in the housing, to be active in a second mode of operation by amplifying the audio signal to drive the speaker when the audio signal has a larger amplitude.

17. The hearable of claim 16, further comprising:
an equalizer in the housing, to spectrally shape the audio signal according to estimated impedance of the speaker, for driving the speaker through the analog current source amplifier.

18. The hearable of claim 16, wherein the analog current source amplifier is configured to drive a current to a first side of the speaker according to the audio signal and drive a second side of the speaker to a selected constant voltage.

19. The hearable of claim 16, further comprising:
a zero crossing detector to detect a zero crossing of the audio signal; and
a transition controller to change between the analog current source amplifier driving the speaker and the class D amplifier driving the speaker, responsive to the zero crossing detector.

20. The hearable of claim 16, wherein each of the analog current source amplifier and the class D amplifier is configured to drive both terminals of the speaker.

* * * * *